United States Patent [19]

Wilson et al.

[11] Patent Number: 4,799,392

[45] Date of Patent: Jan. 24, 1989

[54] METHOD FOR DETERMINING SILICON (MASS 28) BEAM PURITY PRIOR TO IMPLANTATION OF GALLIUM ARSENIDE

[75] Inventors: Syd R. Wilson; Robert P. Lorigan; Richard L. Peterson, all of Phoenix, Ariz.

[73] Assignee: Motorola Inc., Schaumburg, Ill.

[21] Appl. No.: 82,410

[22] Filed: Aug. 6, 1987

[51] Int. Cl.[4] ............................................. G21K 5/00
[52] U.S. Cl. ................................. 73/865.9; 250/492.2; 437/20
[58] Field of Search .................. 73/866, 1 R; 437/24, 437/20, 8, 951, 959; 250/492.2, 492.21, 252.1; 324/64, 71.3

[56] References Cited

U.S. PATENT DOCUMENTS

| | | | |
|---|---|---|---|
| 4,550,031 | 10/1985 | Abrokwah | 437/8 |
| 4,615,766 | 10/1986 | Jackson et al. | 250/492.21 |
| 4,717,829 | 1/1988 | Turner | 250/492.2 |

Primary Examiner—Michael J. Tokar
Assistant Examiner—Robert P. Bell
Attorney, Agent, or Firm—Eugene A. Parsons; Joe E. Barbee

[57] ABSTRACT

A method for determining silicon mass 28 beam purity prior to implanting gallium arsenide by implanting silicon in a silicon monitor wafer and analyzing the damage created by the implantation.

5 Claims, No Drawings

METHOD FOR DETERMINING SILICON (MASS 28) BEAM PURITY PRIOR TO IMPLANTATION OF GALLIUM ARSENIDE

BACKGROUND OF THE INVENTION

This invention pertains to a method for determining silicon (mass 28) beam purity prior to implanting gallium arsenide. The most common implant dopant in gallium arsenide is silicon. Silicon has three isotopes, mass 28, is mass 28. An ion implanter uses magnetic mass analysis to choose the implant species. However, there are two common impurities, in an implanter that also have mass 28. These other impurities which the implanter cannot distinguish from mass 28 silicon, are N2 and CO. The amounts of N2 or CO in the ion beam that passes through the magnet will depend on many variables such as the vacuum in the source area, when the source was last cleaned, how long since the source was vented and the number of carbon apertures that are in the vicinity of the ion source. These variations in percent of carbon monoxide or nitrogen in the silicon beam can cause variation in dose and resultant carrier activation.

In prior art the implantation of carbon monoxide or nitrogen is avoided by implanting silicon mass 29 or mass 30. However, the natural abundance of these species is less than 5% in each case, causing the beam current to be quite small and the time required to implant a wafer to be accurate dose integration becomes difficult.

Unlike implants in silicon where a monitor wafer can be implanted, annealed and measured quickly to see if the implanter is working properly, gallium arsenide must be capped prior to anneal and the cap must be removed subsequent to the anneal in order to probe, greatly increasing the turn aroundtime. Also the use of gallium arsenide wafers as monitors is much more expensive as compared to silicon wafers. Further, in the prior art Si wafers could not be used as monitors since Si implants in Si would not be electrically active.

SUMMARY OF THE INVENTION

The present invention pertains to a method for determining silicon (mass 28) beam purity prior to implanting gallium arsenide. This is accomplished by employing a silicon wafer as a monitor and implanting silicon mass 28 with the beam current being kept at the level of interest. A damage analysis is then done to determine the amount of damage done to the wafer. The amount of damage is then compared to a calibration table and adjustments can be made to the implanter in order to obtain the percentages of doping required.

It is an object of the present invention to provide a new and improved method for determining silicon (mass 28) beam purity.

It is a further object of the present invention to provide a method whereby the implantation of silicon (mass 28) may be done with reliable accuracy.

It is a further object of the present invention to provide a method for determining silicon (mass 28) beam purity prior to implanting gallium arsenide, which utilizes lower cost monitor wafers.

It is a further object of the present invention to provide a method for determining silicon (mass 28) beam purity prior to implanting gallium arsenide that is faster and more efficient.

These and other objects of this invention will become apparent to those skilled in the art upon consideration of the accompanying specification and claims.

DESCRIPTION OF THE EMBODIMENT

Gallium arsenide is a semiconductor material doped by the implantation of silicon ions. There are three naturally occurring silicon ions, mass 28, mass 29, and mass 30. The most abundant is mass 28 while mass 29 and mass 30 each fall below 5%. In prior art, mass 28 silicon is implanted in gallium arsenide using an ion implanter. The implanter, however, is not able to distinguish between mass 28 silicon, CO and N2 which causes an unknown or inaccurate level of doping, since CO and N2 may be implanted, thus altering the effective amount of silicon implanted. Further complicating this is the fact that carbon and oxygen are compensators in gallium arsenide thus further affecting the doping level. In prior art, after implantation, the wafer is capped and annealed. After anneal, the cap is removed and then the dose and uniformity of the dopant is determined by a mercury capacitance-voltage probe. While the dose and uniformity can be determined in this manner it takes a great amount of time which reduces the throughput and increases the cost.

Another way to overcome the impurities present in the implanting beam in prior art is to dope gallium arsenide with silicon mass 29 or mass 30 instead of mass 28. Since there are no other commonly occurring mass 29 or 30 ions, the ion implanter is able to distinguish mass 29 and mass 30 Si from other ions and so results in a pure beam. However, since mass 29 and mass 30 silicon occur naturally in such low quantities, the time of implantation is greatly increased reducing throughput and increasing cost.

In the preferred embodiment of the present invention a monitor wafer is used. The monitor wafer in the preferred embodiment is silicon, but other materials may be used. The silicon wafer is used since it is much less expensive than a gallium arsenide wafer. This monitor wafer is then used to determine the purity of the beam. Since the beam purity is to be found, silicon mass 28 can be implanted, thus increasing the ions present and reducing the amount of time necessary for the implanation.

When gallium arsenide is to be implanted the ion implanter is set to the desired settings and a silicon monitor wafer is run through first. After silicon mass 28 is implanted into the monitor wafer, it is analyzed for damage produced by the implantation. Any known method for analyzing damage to a wafer may be used, but in the preferred embodiment a Therma-wave probe, commercially available through Therma-wave Inc., is used because it is fast, nondestructive and highly sensitive to variations in damage. An analysis of the damage can be used to determine the percentage of silicon as compared to the presence of CO or N2 because silicon mass 28 causes a higher amount of damage than does CO or N2. When implanting ions, there are two types of energy loss or stopping that occur. Nuclear collision, which creates the damage, occurs when a heavier atom penetrates the electron cloud of an atom and undergoes a Coulombic interaction with the nucleus. The nucleus absorbs energy from the ion in the process and is moved off of its lattice site, creating the damage in the crystal lattice. The other type of energy loss or stopping is electronic stopping, caused by a lighter ion coming close to the electron cloud of an atom and ejecting an electron, thereby creating heat but not damage. The stopping of Si in Si is 60 to 90% by nuclear collisions as opposed to electrons depending on the energy. CO and N2 each break apart upon implantation into separate atoms of nitrogen carbon and oxygen, which are much lighter and are stopped to a greater extent by electronic stopping (50%–70% electronic). Thus the difference in damage can be anlayzed and compared. The purity of an ion beam can be determined by comparing the damage done to the monitor wafer with a calibration chart.

A calibration chart is produced by implanting wafers using varied percentages of silicon, carbon monoxide and nitrogen. Example using Si and CO implanted in Si wafers with the tested therma-wave signal values:

| $30_{Si}$ % | $28_{CO}$ % | TW Signal |
|---|---|---|
| 100 Si | 0 CO | 861.5 |
| 90 Si | 10 CO | 847.2 |
| 80 Si | 20 CO | 836.8 |
| 50 Si | 50 CO | 805.9 |
| 20 Si | 80 CO | 786.9 |
| 10 Si | 90 CO | 781.5 |
| 0 Si | 100 CO | 773.4 |

It should be understood that the calibration scale need only be run once to find the amount of damage with the corresponding percent of CO, N2 and silicon.

Beam purity can now be checked by implanting a monitor wafer with silicon mass 28, analyzing the damage and comparing it with the calibration scale. The implanter can then be adjusted to the desired dopant level and be accurate to within 3–5%.

There is thus provided by the present invention a substantially improved method for determining the purity of a beam from an ion implanter. Further, while in prior art, damage to the implanted wafer has been used to monitor dose and uniformity, the present invention uses the fact that different mass ions create different damage to determine the purity of the ion beam itself. This allows for a much higher degree of control over the reduction in time of process and the use of a less expensive substrate as a monitor wafer. The monitor wafer can also be reused many times by annealing out the damage, further reducing costs.

Having thus described the invention it will be apparent to those skilled in the art that various modifications can be made within the spirit and scope of the present invention. For example, while in the preferred embodiment damage was analyzed by a Therma-wave probe, any technique for analyzing data could be used such as prometrics Omnimap, commercially available through Prometrics, Inc., or a similar sheet resistance mapping tool to mesure changes in sheet resistance or an Ion Scan, commercially available through Ion Scan Co., which looks as damage to photoresist on a glass wafer. In this last case a glass wafer would replace the silicon wafer as a monitor wafer.

We claim:

1. A method for determining silicon (mass 28) beam purity prior to implanting a gallium arsenide substrate comprising the steps of:
   forming a lattice disruption calibration scale;
   implanting silicon (mass 28) in a monitor wafer of a substrate other than gallium arsenide;
   analyzing lattice disruption caused to said monitor wafer by the implanted silicon; and
   comparing lattice disruption in said monitor wafer to the lattice disruption of said lattice disruption calibration scale to find the purity of said beam.

2. A method for determining beam purity as claimed in claim 1 wherein the step of forming a lattice disruption calibration scale further comprises the step of using a series of monitor wafers wherein a first monitor wafer has a majority of silicon implanted, a second monitor wafer has a majority of carbon monoxide implanted, a remainder of the series having a variety of varying percentages of carbon monoxide and silicon implanted, and measurements of lattice disruption caused to the monitor wafers by the implantation are taken on each of the monitor wafers to generate the lattice disruption calibration scale by forming a table of measurements taken versus percentages of carbon monoxide and silicon.

3. A method for determining beam purity as claimed in claim 1 wherein the step of forming a lattice disruption calibration scale further comprises the step of using a series of monitor wafers wherein a first monitor wafer has a majority of silicon implanted, a second monitor wafer has a majority of N2 implanted, a remainder of the series having a variety of varying percentages of N2 and silicon implanted, and measurements of lattice disruption caused to the monitor wafers by the implantation are taken on each of the monitor wafers to generate the lattice disruption calibration scale by forming a table of measurements taken versus percentages of carbon monoxide and silicon.

4. A method for determining silicon (mass 28) beam purity prior to implanting Si in a gallium arsenide wafer comprising the steps of:
   using an ion implanter having N2 CO impurities to implant silicon (mass 28) in a monitor wafer;
   analyzing lattice disruption caused to said monitor wafer by the use of the ion implanter to implant the silicon (mass 28); comparing lattice disruption created by CO and N2 to lattice disruption created by silicon (mass 28) to determine percentages of each present in said implanter.

5. A method for implanting a predetermined amount of silicon ions with an ion implanter into a gallium arsenide type wafer, comprising:
   implanting silicon ions into a monitor wafer by using the ion implanter;
   analyzing lattice disruption caused to said monitor wafer by the implanting process;
   adjusting the ion implanter to a predetermined setting based upon the lattice disruption caused to said monitor wafer; and
   implanting silicon ions into the gallium arsenide type wafer.

* * * * *